United States Patent
Mitros et al.

(10) Patent No.: US 6,734,491 B1
(45) Date of Patent: May 11, 2004

(54) EEPROM WITH REDUCED MANUFACTURING COMPLEXITY

(75) Inventors: Jozef C. Mitros, Richardson, TX (US); Imran Khan, Richardson, TX (US); William Nehrer, Soquel, CA (US); Lou Hutter, Plano, TX (US); Dirk Preikszat, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 10/331,705

(22) Filed: Dec. 30, 2002

(51) Int. Cl.[7] ............................................. H01L 29/788
(52) U.S. Cl. ....................... 257/315; 257/316; 257/317; 257/321
(58) Field of Search ................................ 257/314, 315, 257/316, 317, 321

(56) References Cited

U.S. PATENT DOCUMENTS

| | | | |
|---|---|---|---|
| 4,794,433 A | * 12/1988 | Kamiya et al. | 257/321 |
| 5,604,366 A | * 2/1997 | Lee | 257/316 |
| 5,965,913 A | * 10/1999 | Yuan et al. | 257/321 |
| 6,037,625 A | * 3/2000 | Matsubara et al. | 257/315 |
| 6,441,431 B1 | * 8/2002 | Efland et al. | 257/335 |

OTHER PUBLICATIONS

Messmer, Hans–Peter; The Indispensable PC Hardware Book: Your Hardware Questions Answered; Third Edition; Addison Wesley Longman; Essex, England; 1997; pp 514–515.

* cited by examiner

*Primary Examiner*—Thien F Tran
(74) *Attorney, Agent, or Firm*—Peter K. McLarty; W. James Brady, III; Frederick J. Telecky, Jr.

(57) ABSTRACT

A semiconductor device (200) comprising a semiconductor substrate (210) having source and drain regions (530, 540) located in the semiconductor substrate (210) and having similar doping profiles, wherein a channel region (550) extends from the source region (530) to the drain region (540). The semiconductor device (200) also comprises a dielectric layer (230) located over the source and drain regions (530, 540), the dielectric layer (230) having first and second thicknesses ($T_1$, $T_2$) wherein the second thickness ($T_2$) is substantially less than the first thickness ($T_1$) and is partially located over the channel region (550). The semiconductor device (200) also comprises a gate (510) located over the dielectric layer (230) wherein the second thickness ($T_2$) is located between an end (515) of the gate (510) and one of the source and drain regions (530, 540).

5 Claims, 7 Drawing Sheets

EEPROM WITH REDUCED MANUFACTURING COMPLEXITY

TECHNICAL FIELD OF THE INVENTION

The present invention is directed, in general, to semiconductor devices and, more specifically, to an electrically erasable programmable read-only-memory (EEPROM) that has a reduced area and that is more cost effective to manufacture.

BACKGROUND OF THE INVENTION

As is well known, an EEPROM is a user-modifiable read-only memory that can be erased and reprogrammed repeatedly through the application of higher than normal electrical voltage. In general, EEPROM cells have proven to be a reliable and versatile form of nonvolatile reprogrammable memory.

Figure 1:
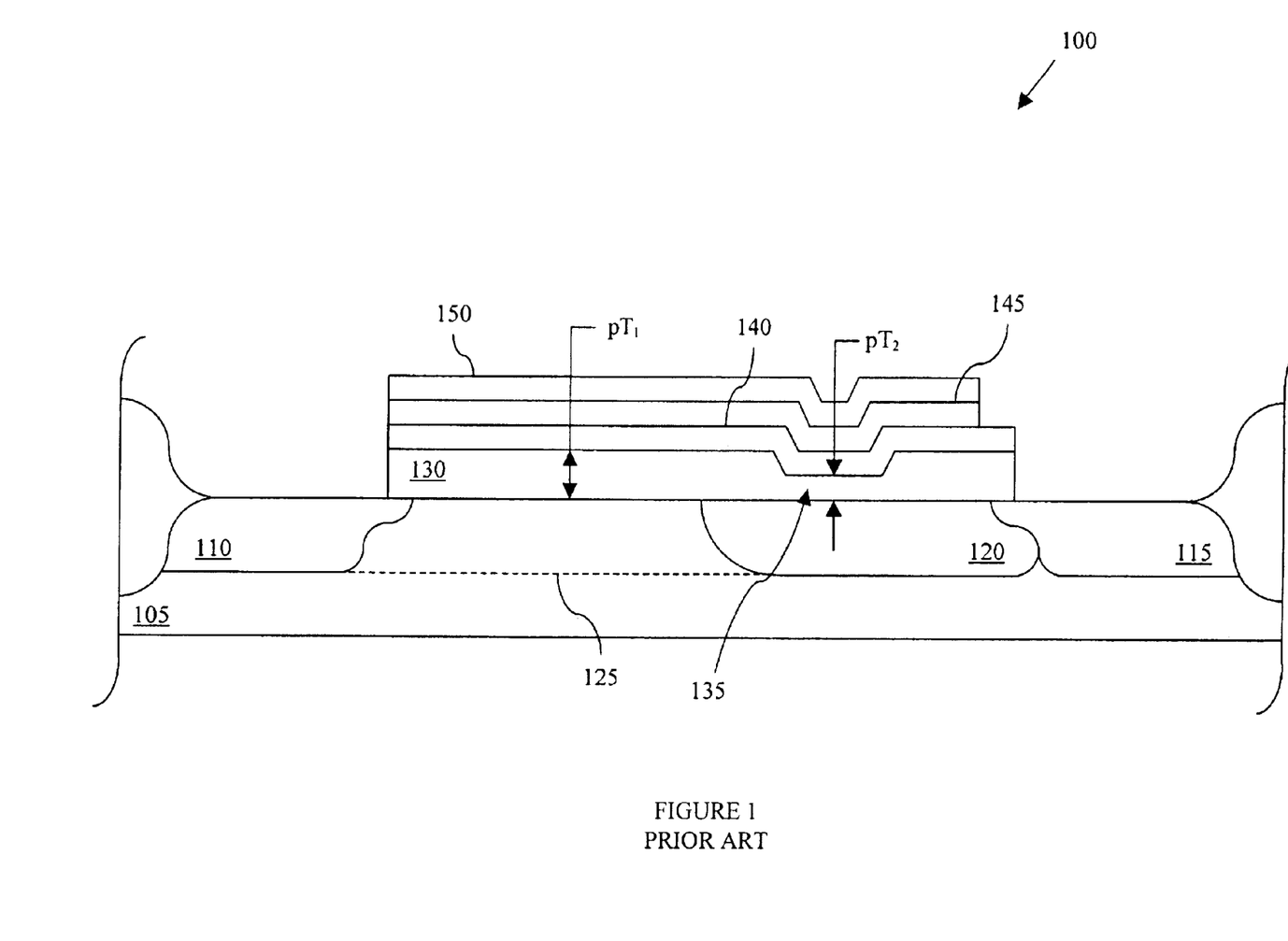
FIG. 1 illustrates a conventional EEPROM device.

FIG. 1 illustrates a conventional EEPROM device 100. The EEPROM device 100 includes a semiconductor substrate 105 having a source implant 110, a drain implant 115 and an additional EEPROM implant 120 formed therein, wherein the EEPROM implant 120 is employed to connect the drain 115 with a tunneling region 135. A channel region 125 in the semiconductor substrate 105 is defined between the source implant 110 and EEPROM implant 120. A first dielectric layer 130 is located at least over the channel region 125 and the EEPROM implant 1.20. The first dielectric layer 130 includes a first thickness $pT_1$ over the channel region 125 and a second thickness $pT_2$ over the EEPROM implant 120, wherein the second thickness $pT_2$ is substantially less than the first thickness $pT_1$. The EEPROM device 100 also includes a floating gate 140, a second dielectric layer 145, and a control gate 150 sequentially formed over the first dielectric layer 130, each conforming to the contour of the first dielectric layer 130.

Despite the success of EEPROM cells as a reliable and versatile form of nonvolatile reprogrammable memory, conventional EEPROM devices, such as the one illustrated in FIG. 1, have their drawbacks. One such drawback regards the typical integration of conventional EEPROM cells into existing complimentary metal oxide semiconductor (CMOS) manufacturing processes. Typically, with continued reference to the EEPROM device 100 shown in FIG. 1, the first dielectric layer 130 may be formed simultaneously with the gate oxide of a conventional CMOS and the floating gate 140 may be formed simultaneously with the gate of a conventional CMOS, wherein the conventional CMOS may be a high-voltage CMOS.

However, the integration of the EEPROM manufacturing process into conventional CMOS manufacturing processes requires additional manufacturing steps. For example, this integration requires additional process steps to form the EEPROM implant 120, the first dielectric layer 130, the second dielectric layer 145 and the control gate 150. The additional process steps add significant cost and time in fabricating the devices. Moreover, the additional process steps render acceptable defect density more difficult to achieve. Additional production costs are also incurred when the additional steps can not be easily integrated with existing processes. Faced with ever increasing demands for smaller devices, higher yields at lower cost, and reduced production times, it follows that any additional processing steps are undesirable.

Accordingly, what is needed in the art is an EEPROM or other semiconductor device that does not suffer from the deficiencies found in the prior art.

SUMMARY OF THE INVENTION

To address the above-discussed deficiencies of the prior art, the present invention provides, in one embodiment, a semiconductor device comprising a semiconductor substrate having source and drain regions located therein and having similar doping profiles, wherein a channel region extends from the source region to the drain region. The semiconductor device also comprises a dielectric layer located over the source and drain regions and having first and second thicknesses wherein the second thickness is substantially less than the first thickness and is partially located over the channel region. The semiconductor device also comprises a gate located over the dielectric layer wherein the. second thickness is located between an end of the gate and one of the source and drain regions.

In another embodiment, the present invention provides a method of manufacturing a semiconductor device, the method comprising implanting source and drain regions having similar doping profiles in a semiconductor substrate, thereby defining a channel region extending from the source region to the drain region. The method also comprises locating a dielectric layer over the source and drain regions, wherein the dielectric layer includes first and second thicknesses. The second thickness is substantially less than the first thickness and is partially located over the channel region. The method also comprises forming a gate over the dielectric layer wherein the second thickness is located between an end of the gate and one of the source and drain regions.

In yet another embodiment, the present invention provides an integrated circuit comprising memory cells and transistors formed at least partially within a semiconductor substrate. The memory cells include source and drain regions located in the semiconductor substrate and have similar doping profiles, wherein a channel region extends from the source region to the drain region. The memory cells also include a dielectric layer located over the source and drain regions and have first and second thicknesses, wherein the second thickness is substantially less than the first thickness and is partially located over the channel region. The memory cells also comprise a gate located over the dielectric layer wherein the second thickness is located between an end of the gate and one of the source and drain regions. The integrated circuit also includes interconnects that connect the transistors and the memory cells to form an operative integrated circuit.

The foregoing has outlined features of the present invention such that those skilled in the art may better understand the detailed description of the invention that follows. Additional features of the invention will be described hereinafter that form the subject of the claims of the invention. Those skilled in the art should appreciate that t they can readily use the disclosed conception and specific embodiment as a basis for designing or modifying other structures for carrying out the same purposes of the present invention. Those skilled in the art should also realize that such equivalent constructions do not depart from the spirit and scope of the present invention.

BRIEF DESCRIPTION OF THE DRAWINGS

For a more complete understanding of the present invention, reference is now made to the following detailed description taken in conjunction with the accompanying FIGURES. It is emphasized that various features may not be drawn to scale. In fact, the dimensions of various features may be arbitrarily increased or reduced for clarity of discussion. In addition, it is emphasized that some circuit components may not be illustrated for clarity of discussion. Reference is now made to the following descriptions taken in conjunction with the accompanying drawings, in which.

DETAILED DESCRIPTION

Figure 2:
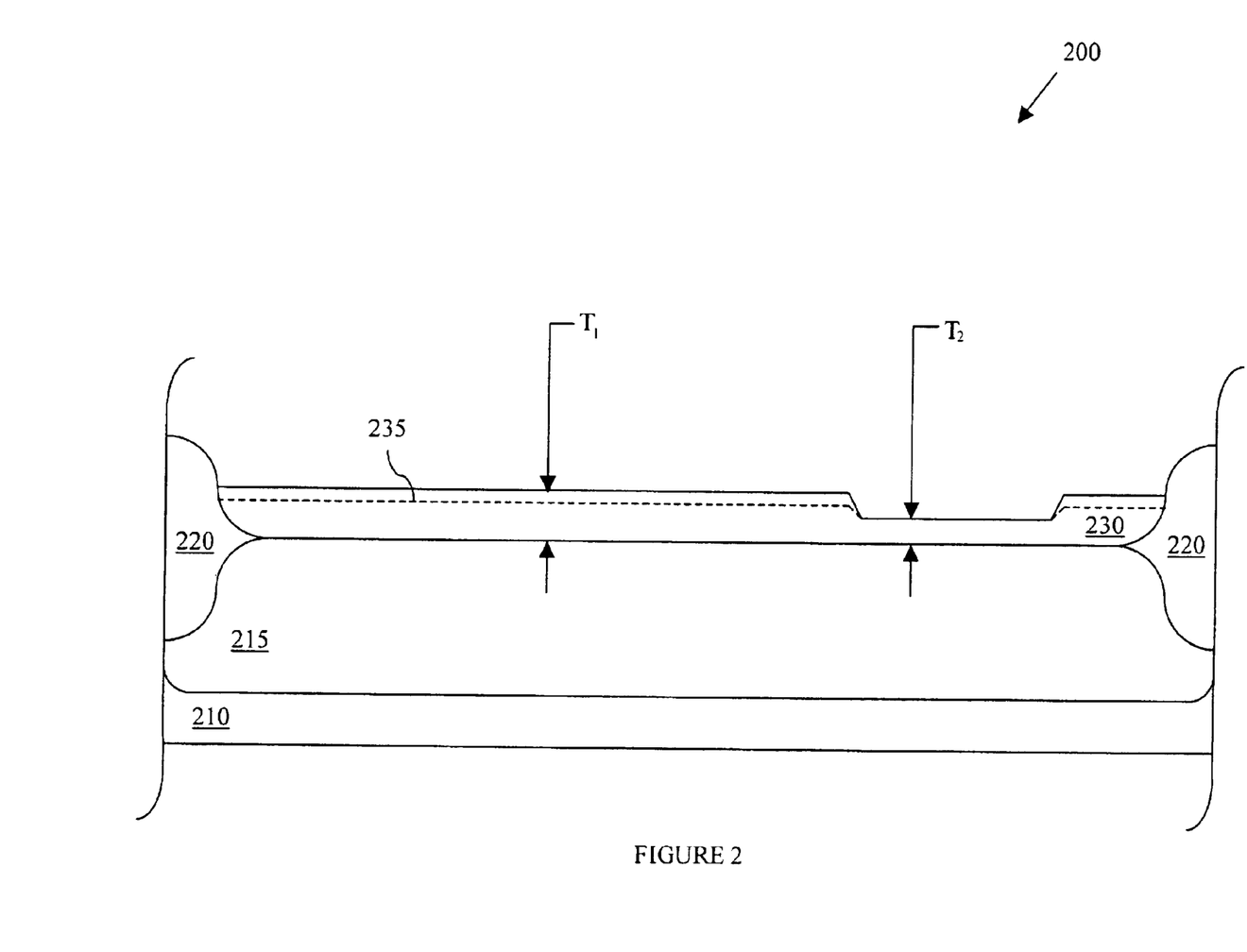
FIG. 2 illustrates a section view of an embodiment of a semiconductor device in an early stage of manufacture according to the principles of the present invention.

Referring to FIG. 2, illustrated is a section view of an embodiment of a semiconductor device 200 in an initial stage of manufacture according to the principles of the present invention. The method of manufacturing the semiconductor device 200 initiates with the provision of a semiconductor substrate 210. The semiconductor substrate 210 may comprise a silicon having a p-type or n-type conductivity. In one embodiment, the semiconductor substrate 210 may have a 4-degree-off orientation or a <100>$C_Z$ crystal structure. The semiconductor substrate 210 may also be a monolithic substrate (p-type or n-type doped) or may have a conventional epi layer located thereon. The semiconductor substrate 210 may also have a substrate resistivity ranging between about 5 and about 50 ohms-cm, and preferably between about 5 and about 15 ohms-cm. In one embodiment, the substrate resistivity of the semiconductor substrate 210 may be about 7 ohms-cm.

As shown in FIG. 2, a well 215 is conventionally formed in the substrate 210, such as by implanting an n-type or p-type dopant. In one embodiment, a conventional complimentary CMOS doping scheme having alternating wells of p-type and n-type doping may be utilized, such that the well 215 may merely be one of the n-type or p-type doped regions in the conventional CMOS doping scheme. This aspect of the present invention allows for easy integration into existing CMOS, EEPROM or other semiconductor device fabrication processes.

The semiconductor device 200 may include field oxide regions 220 formed between portions of a patterned first dielectric layer 230. The field oxide regions 220 and first dielectric layer 230 may be conventionally formed, such as by deposition or epitaxial growth, and may comprise silicon dioxide or compounds thereof. In one embodiment, conventional shallow-trench-isolation regions (not shown) could be used instead of or in combination with the field oxide regions 220.

As shown in FIG. 2, the first dielectric layer 230 may have a first thickness $T_1$ and a second thickness $T_2$, wherein the second thickness $T_2$ is substantially less than the first thickness $T_1$. In the first thickness $T_1$ may range between about 20 nm and about 40 nm and the second thickness $T_2$ may range between about 6 nm and about 15 nm. In a more specific embodiment, the first thickness $T_1$ may range between about 28 nm and about 36 nm, and the second thickness $T_2$ may range between about 7.5 nm and about 12.5 nm.

The second thickness $T_2$ may be formed by etching a deposited or grown layer of conventional dielectric material (having a thickness equal to or slightly less than the first thickness $T_1$) through a patterned photoresist (not shown) to expose a portion of the underlying semiconductor substrate 210 where the second thickness $T_2$, is to be formed. Thereafter, the semiconductor substrate 210 may be exposed to a conventional oxidizing environment, thereby forming the second thickness $T_2$. In this manner, the first dielectric layer 230 may include an interface 235, as represented by the dashed line shown in FIG. 2. Of course, those skilled in the art will recognize that other techniques may be employed to form the first dielectric layer 230 having first and second thicknesses $T_1$, $T_2$. Moreover, the present invention is not limited to employing multiple dielectric layers in order to form a dielectric layer having first and second thicknesses. Accordingly, those skilled in the art understand that the dielectric layer 230 of the present invention may be a single-or multi-layered dielectric layer constructed according to conventional or future developed techniques.

Figure 3:
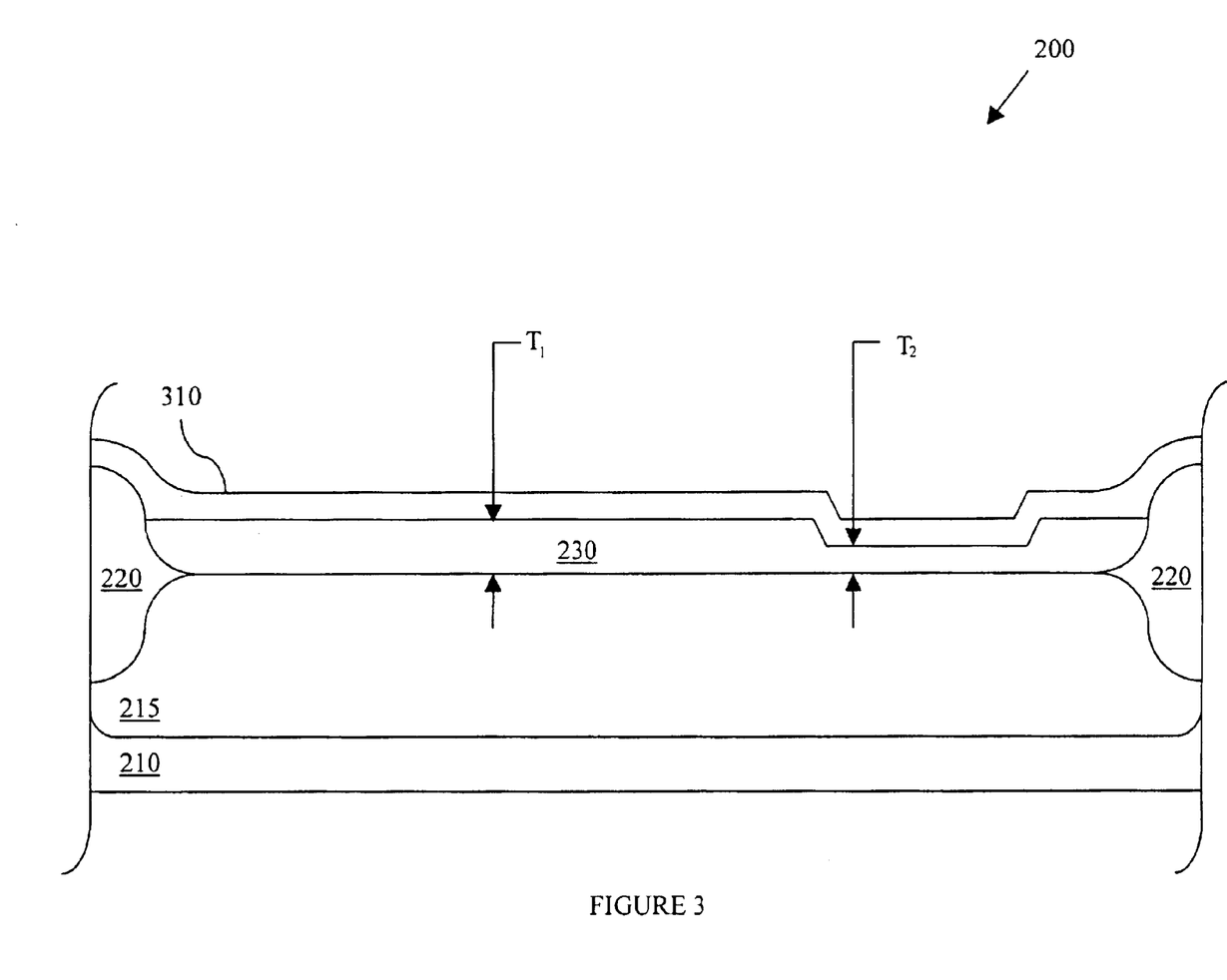
FIG. 3 illustrates a section view of the semiconductor device shown in FIG. 2 in a subsequent stage of manufacture according to the principles of the present invention.

Turning to FIG. 3, illustrated is a section view of the partially completed semiconductor device 200 shown in FIG. 2 after a conventional blanket deposition of a first gate material 310 provided over the first dielectric layer 230. The first gate material 310 may comprise any conductive material, including polysilicon that is subsequently doped to increase its conductivity. As shown in FIG. 3, the first gate material 310 preferably conforms to the first and second thicknesses $T_1$, $T_2$ of the first dielectric layer 230.

Figure 4:
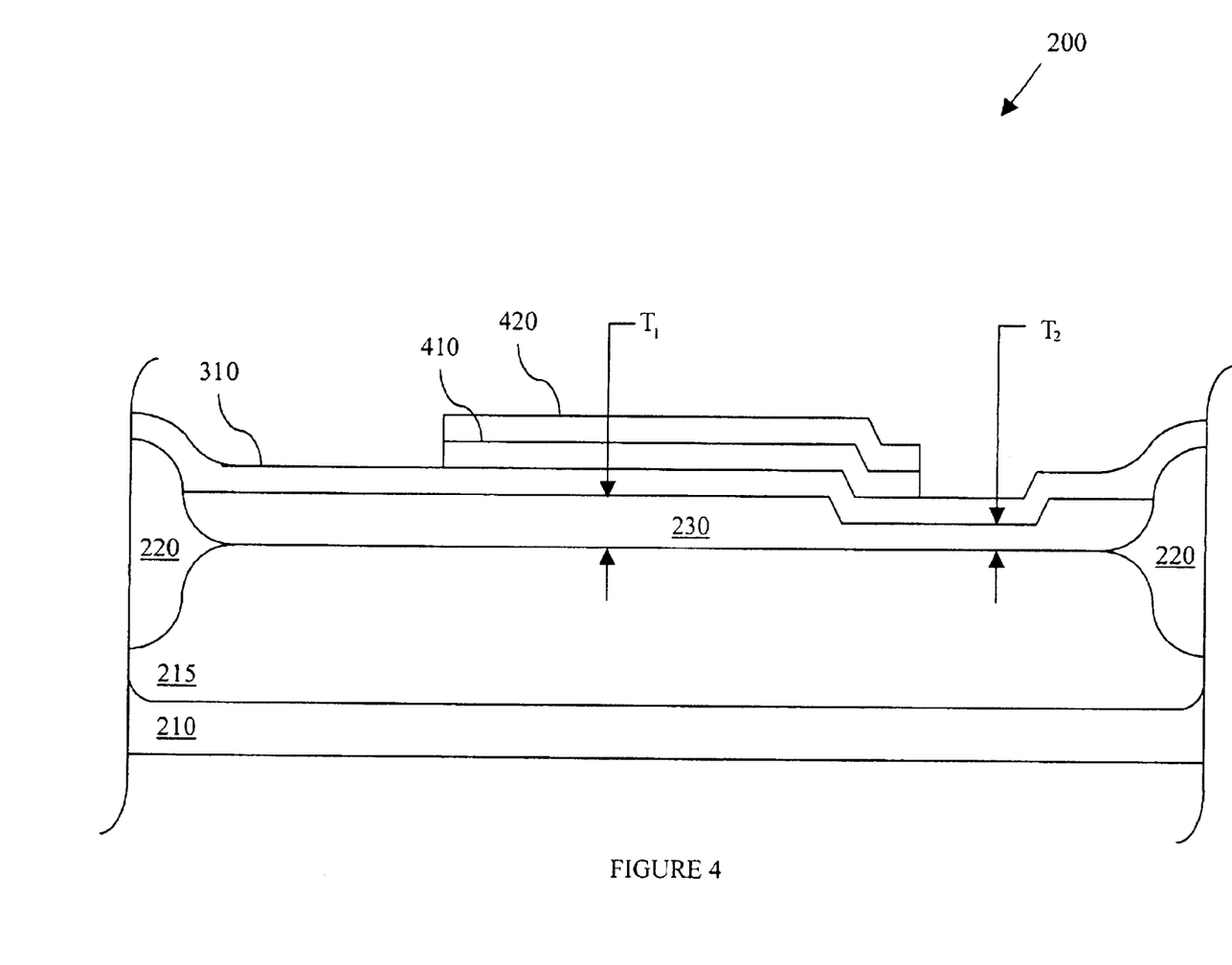
FIG. 4 illustrates a section view of the semiconductor device shown in FIG. 3 in a subsequent stage of manufacture according to the principles of the present invention.

Turning to FIG. 4, illustrated is a section view of the partially completed semiconductor device 200 shown in FIG. 3 after a second dielectric layer 410 and a second gate 420 have been conventionally formed over the first gate material 310. The second dielectric layer 410 may comprise silicon dioxide or compounds thereof, and may be formed by blanket deposition and subsequent etching through a patterned photoresist (not shown). The second dielectric layer 410 may have a thickness ranging between about 15 nm and about 30 nm. The second gate 420 may also be formed by conventional photolithography techniques, such as by etching a blanket deposition through a patterned photoresist. In one embodiment, the second gate 420 may comprise doped polysilicon, copper, aluminum, tungsten, titanium or compounds or alloys thereof, and may have a thickness ranging between about 100 nm and about 400 nm. In a more specific embodiment, the second gate 420 may have a thickness ranging between about 250 nm and about 350 nm. In one embodiment, the second gate 420 and second dielectric layer 410 may be simultaneously etched, such as through a single patterned photoresist.

Figure 5:
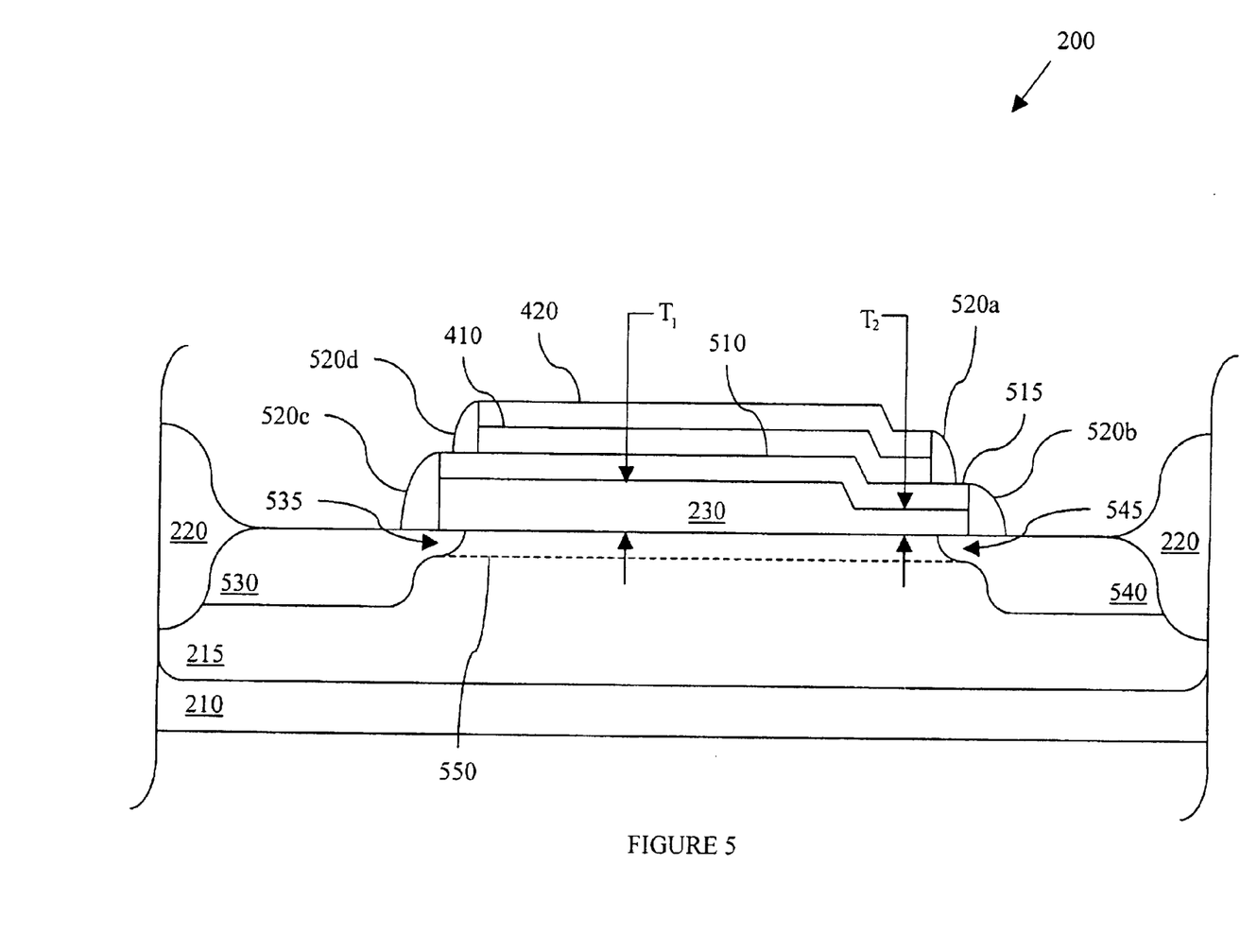
FIG. 5 illustrates a section view of the semiconductor device shown in FIG. 4 in a subsequent stage of manufacture according to the principles of the present invention.

Turning to FIG. 5, illustrated is the semiconductor device 200 shown in FIG. 4 after the first gate material 310 has been etched to form a first gate 510. The first gate 510 is patterned such that an end 515 of the first gate 510 is located over the second thickness $T_2$ of the first dielectric layer 230. The first dielectric layer 230 may be simultaneously etched with the first gate 510 such that the first gate 510 and the remainder of first dielectric layer 230 have substantially similar lengths.

As shown in FIG. 5, conventional spacers 520a, 520b, 520c, 520d may be formed as depicted and conventional source and drain regions 530, 540 may be formed in the well 215. The source and drain regions 530, 540 are preferably doped with an opposite dopant type than the dopant type of the well 215, and may include lightly doped regions 535, 545, respectively. In one embodiment, the lightly doped regions 535, 545 may be conventionally formed prior to the formation of the spacers 520a, 520b, 520c, 520d such as by well known ion implanting techniques. In such embodiments, the remainder of the source and drain regions 530, 540 may be formed after the formation of the spacers 520a, 520b, 520c, 520d during a second ion implant, thereby creating a conventional stair-stepped profile as illustrated in FIG. 5. The partially completed semiconductor device 200 may also be subjected to a conventional anneal or RTP process which may diffuse the source and drain regions 530, 540.and their respective lightly doped regions 535, 545 at least partially underneath the spacers 520b and 520c and/or the first dielectric layer 230 and first gate 510. Thus, at least the end 515 of the first gate 510 may at least partially overlap the drain region 540 or its lightly doped region 545. The advantages of such an overlap are discussed below.

The source and drain regions 530, 540 preferably have similar or identical doping profiles. For example, both of the source and drain regions 530, 540 may be n-doped to a concentration of about 1.0E20 atoms/cm$^3$ (n+), and both of the lightly doped regions 535, 545 may be n-doped to a concentration substantially ranging between about 1.0E17 atoms/cm$^3$ and about 1.0E18 atoms/cm$^3$ (n−). Moreover, those skilled in the art understand that the source and drain regions 530, 540 may be interchanged, and that any references herein to a specific one of the source and drain regions 530, 540 or their lightly doped regions 535, 545 are made merely for the sake of simplicity.

The source and drain regions 530, 540 define a channel region 550, such that the channel region 550 extends between the source and drain regions 530, 540 as illustrated by the dashed line in FIG. 5. Consequently, the channel region 550 forms a junction or interface with each of the source and drain regions 530, 540. Of course, the channel region 550 shown in FIG. 4 may have a different shape than that represented in FIG. 5 and still extend between the source and drain regions 530, 540. Moreover, by describing the channel region 550 as extending between the source and drain regions 530, 540, it is intended that the channel region 550 is in direct contact with no other features, such as the conventional EEPROM implant 120 shown in FIG. 1.

The elimination of the additional process steps conventionally required for forming an EEPROM implant (such as the EEPROM implant 120 in FIG. 1) may result in decreased manufacturing costs and time, device size and complexity, and defect density. Eliminating the processes steps conventionally required for forming an EEPROM implant also enables the integration of EEPROM fabrication processes into existing CMOS technology with greater ease compared to conventional EEPROM fabrication processes, because fewer steps require integration.

Figure 6:
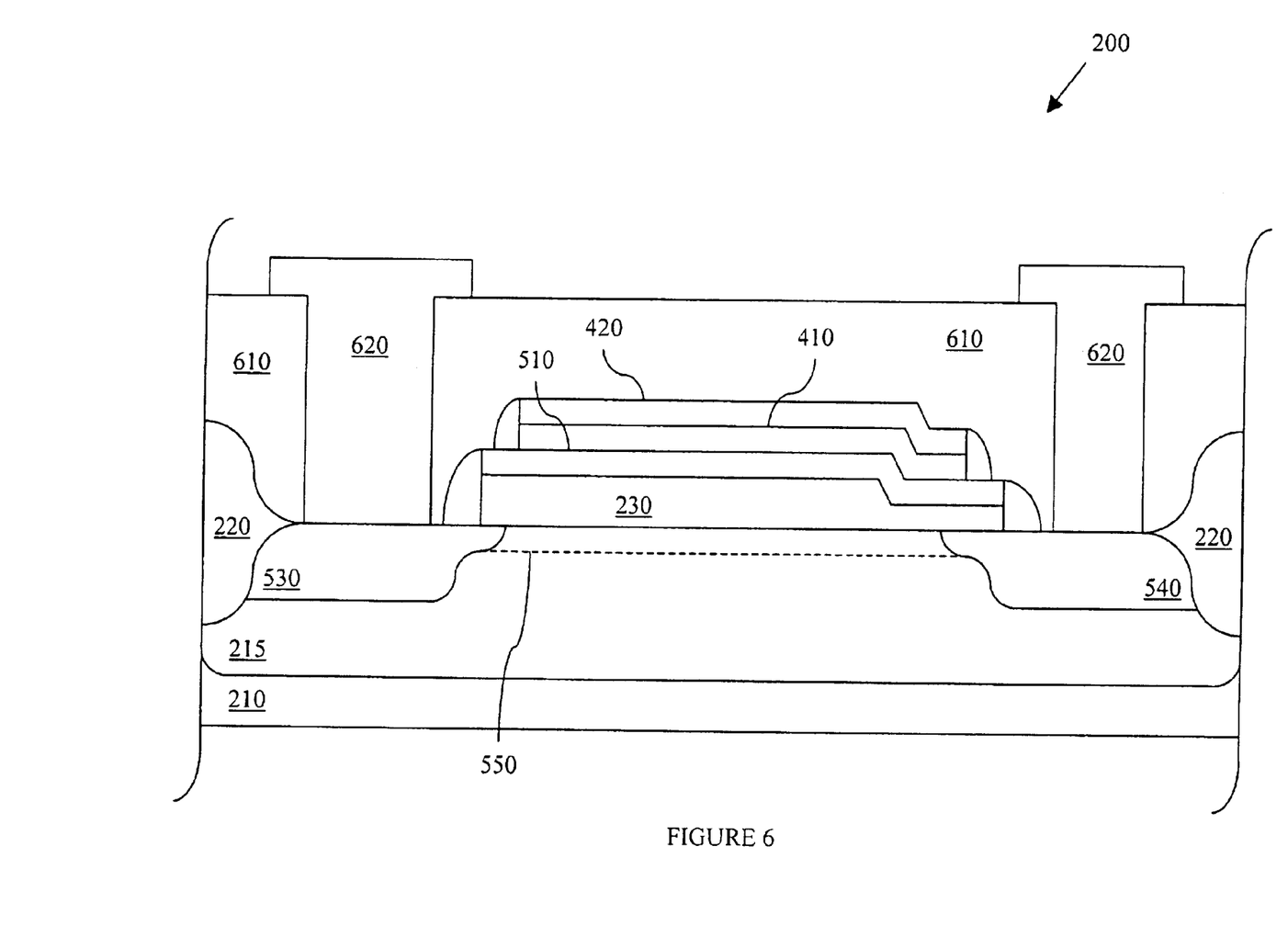
FIG. 6 illustrates a section view of the semiconductor device shown in FIG. 5 in a subsequent stage of manufacture according to the principles of the present invention.

Turning to FIG. 6, illustrated is the partially completed semiconductor device 200 shown in FIG. 5 after the conventional formation of a third dielectric layer 610 and contacts 620 therein. The third dielectric layer 610 may be formed by deposition or other conventional means, may comprise a blanket deposit of silicon dioxide or other conventional dielectric materials, and may have a thickness ranging between about 40 nm and about 500 nm.

A plurality of openings may be formed in the third dielectric layer 610 and subsequently filled with a metallic material, thereby forming the contacts 620 electrically connected to the source/drain regions 530, 540. In one embodiment, the contacts 620 may comprise copper, aluminum, tungsten, titanium or compounds or alloys thereof. Moreover, although not shown in FIG. 6, the semiconductor device 200 may also include a conventional contact barrier comprising titanium or titanium nitride and lining the interface between each contact 620 and the third dielectric layer 610. The semiconductor device 200 may also include a titanium or titanium nitride barrier layer (not shown) between the contacts 620 and the source 530 and the drain 540.

Thus, with continued reference to FIG. 6, the present invention provides a semiconductor device 200 wherein the channel region 550 extends from the source region 530 to the drain region 540. As discussed above, the channel region 550 directly contacts the source and drain regions 530, 540, thereby advantageously eliminating the conventional EEPROM implant 120 shown in FIG. 1 and the processing steps required of its formation, as discussed above. Moreover, those skilled in the art will recognize that, in some embodiments, the semiconductor device 200 of the present invention may be an EEPROM device or other memory cell. That is, the first gate 510 may be a floating gate and the second gate 420 may be a control gate. In such embodiments, the elimination of the EEPROM implant 120 shown in FIG. 1 and the overlap of the first gate 510 over the drain 540 provides additional advantages of the present invention, as discussed below.

Specifically, the elimination of the conventional EEPROM implant decreases the overall cost and complexity of the semiconductor device 200 and its manufacture. Moreover, the device 200 is easily integrated into existing CMOS and other semiconductor device manufacturing processes, because the first gate 510 is still formed in the same manufacturing step as with conventional processes, such that the elimination of the conventional EEPROM implant reduces the number of steps and reticles typically required of conventional EEPROM manufacturing processes.

Additionally, the coupling ratio $C_r$ of the semiconductor device 200 is increased. Those skilled in the art understand that the coupling ratio $C_r$ of an EEPROM device may be expressed by the following equations:

$$C_r = V_{fg}/V_{cg} \qquad (1)$$

$$C_r = C_{cg\_fg}/(C_{cg\_fg} + C_{fg\_sub}) \qquad (2)$$

where $V_{fq}$ is the operating voltage of a conventional floating gate, $V_{cg}$ is the operating voltage of a convention control gate (420), $C_{cg\_fg}$ is the capacitance formed by the control gate and the floating gate, and $C_{fg\_sub}$ is the capacitance formed by the floating gate and a substrate thereunder. Applying Equations (1) and (2) to the present invention, reducing the length of the first gate 510 reduces the capacitance formed by the first gate 510 and the semiconductor substrate 210 ($C_{fq\_sub}$), ,which corresponds to an increased coupling ratio $C_r$. Also, the coupling ratio is increased due to the smaller thin oxide area over the drain region 540. By increasing the coupling ratio $C_r$. the operating voltage of the second gate 420 ($V_{cg}$) is reduced for a given operating voltage of the first gate 510 ($V_{fq}$), thereby decreasing the operating voltage requirements for the second gate 420 required for nominal operation of the semiconductor device 200.

Many of the advantages discussed above relate to increasing the coupling ratio $C_r$ of the semiconductor device 200 by various means. In that regard, it may be helpful to quantify examples of these advantages over conventional devices. For reference, conventional EEPROM devices typically exhibit a coupling ratio $C_r$ of less than about 0.5. To that extent, a conventional EEPROM device requires a control gate operating voltage $V_{cq}$ of at least about 15 volts in order to achieve a nominal floating gate voltage $V_{fq}$ of about 7.5 volts. However, embodiments of an EEPROM or other semiconductor device constructed according to the principles of the present invention, such as the semiconductor device 200 shown in FIG. 6, may exhibit a coupling ratio $C_r$ well above 0.5. In a more specific embodiment, the coupling ratio $C_r$ may be at least about 0.7. In such an embodiment, a control gate voltage $V_{cg}$ of only about 10 volts may be required to achieve the nominal floating gate voltage $V_{tq}$ of about 7 volts.

Figure 7:
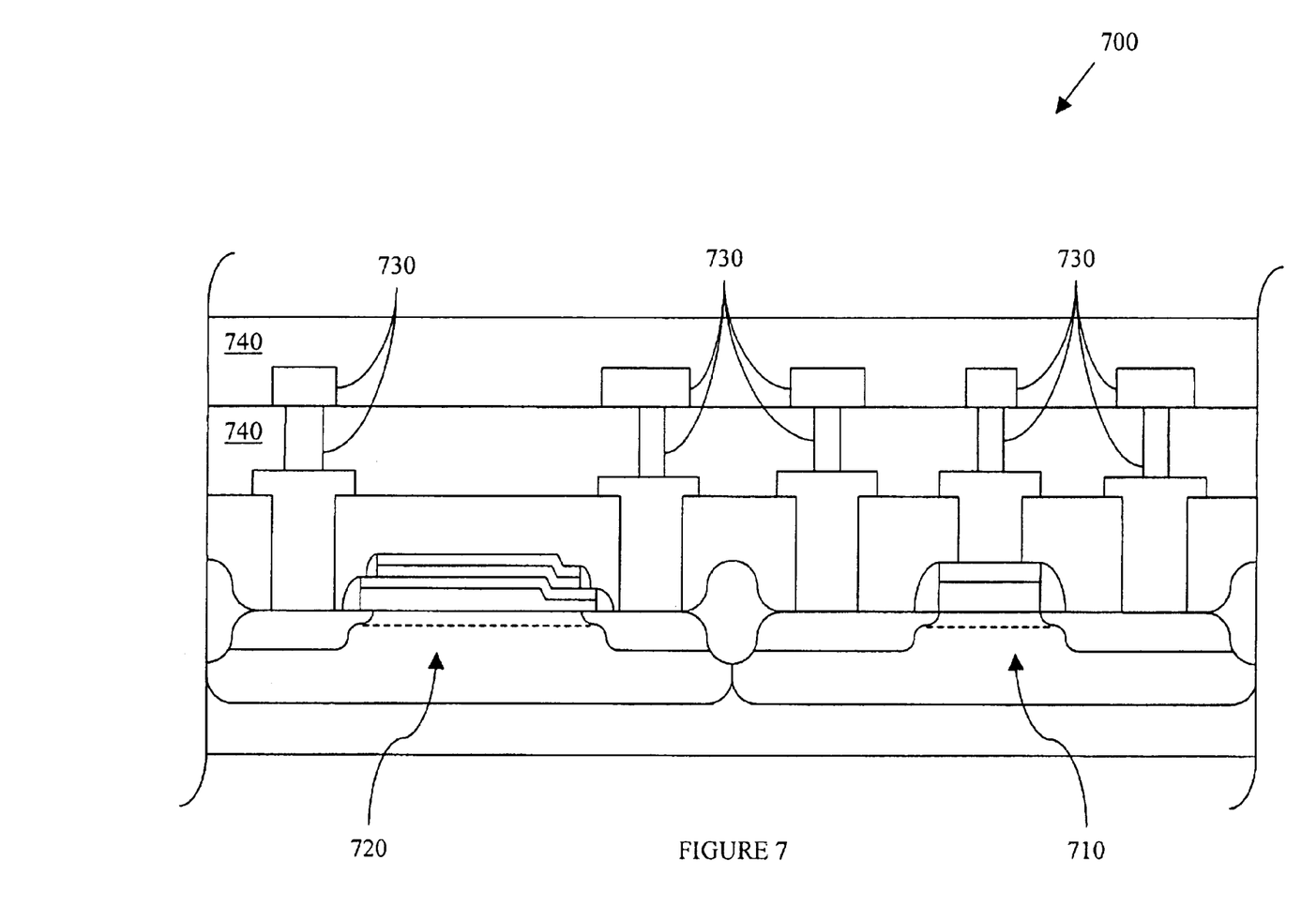
FIG. 7 illustrates a section view of an embodiment of an integrated circuit device constructed according to the present invention.

Turning briefly to FIG. 7, illustrated is a section view of one embodiment of an integrated circuit device 700 which may be one environment within which a semiconductor device constructed according to the present invention, such as the semiconductor device 200 shown in FIG. 6, may be incorporated. The integrated circuit device 700 may include active devices 710, such as transistors used to form CMOS devices, bipolar devices, or other types of active devices. The integrated circuit device 700 may also include passive devices (not shown), such as capacitors, inductors and resistors., Those skilled in the art are familiar with these various types of devices and their manufacture.

In the particular embodiment illustrated in FIG. 7, the integrated circuit device 700 also includes one or more memory cells 720, as provided by the present invention and as discussed above with respect to FIG. 6. The memory cells 720 may be EEPROM cells. The integrated circuit device 700 also includes conventional interconnect structures 730 located within one or more dielectric layers 740 to interconnect the active and/or passive devices to form an operative integrated circuit.

Although the present invention has been described in detail, those skilled in the art should understand that they can make various changes, substitutions and alterations herein without departing from the spirit and scope of the invention.

What is claimed is:

1. An integrated circuit, comprising:
    transistors formed over or in a semiconductor substrate;
    memory cells, including:
        source and drain regions located in said semiconductor substrate and having similar doping profiles;
        a channel region extending from said source region to said drain region;
        a dielectric layer located over said channel region and having first and second thicknesses wherein said second thickness is substantially less than said first thickness and is partially located over said channel region; and
        a gate located over said dielectric layer wherein a portion of said second thickness is located between an end of said gate and one of said source and drain regions;
    the source and drain regions each include a lightly doped region, wherein said end of gate and said second thickness are located over one of said lightly doped regions; and
    interconnects connecting said transistors and said memory cells to form an integrated circuit.

2. The integrated circuit recited in claim 1 wherein said memory cells are EEPROM cells.

3. The integrated circuit recited in claim 1 wherein said first thickness ranges between about 25 nm to about 50 nm and said second thickness ranges between about 6 nm and about 20 nm.

4. The integrated circuit recited in claim 1 wherein a coupling ratio of each of said memory cells is at least about 0.7.

5. An integrated circuit, comprising:
    transistors formed over or in a semiconductor substrate;
    memory cells, including:
        source and drain regions located in said semiconductor substrate and having similar doping profiles;
        a channel region extending from said source region to said drain region;
        a dielectric layer located over said channel region and having first and second thicknesses wherein said second thickness is substantially less than said first thickness and is partially located over said channel region; and
        a gate located over said dielectric layer wherein a portion of said second thickness is located between an end of said gate and one of said source and drain regions;
    the source and drain regions include a doping concentration of about 1.0E20 atoms/cm$^3$ and said memory cells further include lightly doped regions have a doping concentration ranging between about 1.0E17 atoms/cm$^3$ and about 1.0E18 atoms/cm$^3$; and
    interconnects connecting said transistors and said memory cells to form an integrated circuit.

* * * * *